United States Patent
Guan et al.

(10) Patent No.: US 10,998,189 B2
(45) Date of Patent: May 4, 2021

(54) LASER ANNEALING PROCESS OF DRIVE BACKPLANE AND MASK

(71) Applicant: BOE TECHNOLOGY GROUP CO., LTD., Beijing (CN)

(72) Inventors: Feng Guan, Beijing (CN); Zhi Wang, Beijing (CN); Chen Xu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/569,311

(22) Filed: Sep. 12, 2019

(65) Prior Publication Data

US 2020/0251327 A1 Aug. 6, 2020

(30) Foreign Application Priority Data

Feb. 2, 2019 (CN) .......................... 201910107922.5

(51) Int. Cl.
| | |
|---|---|
| *H01L 21/02* | (2006.01) |
| *B23K 26/06* | (2014.01) |
| *H01L 21/306* | (2006.01) |
| *H01L 23/544* | (2006.01) |
| *H01L 27/12* | (2006.01) |
| *B23K 26/354* | (2014.01) |

(52) U.S. Cl.
CPC ...... *H01L 21/0268* (2013.01); *B23K 26/0648* (2013.01); *B23K 26/354* (2015.10); *H01L 21/30604* (2013.01); *H01L 23/544* (2013.01); *H01L 27/1274* (2013.01); *H01L 27/1288* (2013.01); *H01L 2223/54426* (2013.01)

(58) Field of Classification Search
None
See application file for complete search history.

(56) References Cited

U.S. PATENT DOCUMENTS

| | | | |
|---|---|---|---|
| 2004/0134417 A1* | 7/2004 | Kim | H01L 21/0268 117/89 |
| 2004/0173862 A1 | 9/2004 | Oohara et al. | |
| 2018/0366327 A1* | 12/2018 | Mizumura | H01L 21/02433 |
| 2020/0176284 A1* | 6/2020 | Mizumura | H01L 27/1285 |

FOREIGN PATENT DOCUMENTS

| | | |
|---|---|---|
| CN | 1514469 A | 7/2004 |
| CN | 103081060 A | 5/2013 |
| CN | 109062001 A | 12/2018 |
| TW | 201812924 A | 4/2018 |
| WO | WO-2011/158612 A1 | 12/2011 |

OTHER PUBLICATIONS

Chinese Office Action dated Jun. 3, 2020, from application No. 201910107922.5.

* cited by examiner

*Primary Examiner* — Shamim Ahmed
(74) *Attorney, Agent, or Firm* — Thomas | Horstemeyer, LLP

(57) ABSTRACT

A laser annealing process of a drive backplane includes: providing a mask, which has a light transmission area; and sequentially moving the mask to cover different areas of an amorphous silicon layer of the drive backplane, and annealing the amorphous silicon layer exposed in the light transmission area to form a poly-silicon pattern.

11 Claims, 4 Drawing Sheets

LASER ANNEALING PROCESS OF DRIVE BACKPLANE AND MASK

CROSS-REFERENCE TO RELATED APPLICATIONS

This application is based upon and claims priority to Chinese Patent Application No. 201910107922.5, filed on Feb. 2, 2019, the entire contents thereof are incorporated herein by reference.

TECHNICAL FIELD

This disclosure relates to a technical field of preparation process for a display device, in particular to a laser annealing process of a drive backplane and a mask.

BACKGROUND

A low temperature poly-silicon (LTPS) backplane has a greater mobility and is suitable for applications in a current-driven backplane, such as OLED. In the existing poly-silicon technology, the poly-silicon are prepared by use of the LTPS technology. During the process, an amorphous silicon layer is firstly prepared, and then crystallized by a laser annealing technology to form poly-silicon TFT channels to improve mobility of the device. However, there are problems such as repeated irradiation, which do not permit to obtain better uniformity on a large-area substrate (for example, a substrate product produced by a sixth generation production line or the larger-size products produced by the updated generation production line), and are not suitable for development of large-area panel process, and also there are problems of difficult alignment caused by complex peripheral circuits, and frequent replacement and time consumption of the mask, etc.

SUMMARY

According to one aspect of the present disclosure, a laser annealing process performed on a drive backplane includes providing a mask having a light transmission area. The method includes sequentially moving the mask to cover different areas of the amorphous silicon layer of the drive backplane. Any two of the different areas are not overlapped. The method includes annealing the amorphous silicon layer exposed in the light transmission area to form a poly-silicon pattern every time the mask moves.

According to one arrangement of the present disclosure, the light transmission area of the mask is provided with an optical element for adjusting transmitted lights.

According to one arrangement of the present disclosure, the optical element includes a micro-lens or a micro-lens group, configured to focus a laser beam emitted from the laser source.

According to one arrangement of the present disclosure, size of the micro-lens is presented in a nanometer or in a micrometer.

According to one arrangement of the present disclosure, the mask includes a plurality of the light transmission areas.

According to one arrangement of the present disclosure, a plurality of the light transmission areas are arranged on the mask in an array of m×n, in which m≥1 and n≥1.

According to one arrangement of the present disclosure, a plurality of the light transmission areas have an identical shape and size.

According to one arrangement of the present disclosure, the amorphous silicon layer includes a plurality of the areas, and each of the areas is irradiated by a laser for one time.

According to one arrangement of the present disclosure, the mask covers some of the plurality of areas positioned in a display area of the drive backplane and some of the plurality of areas positioned in a non-display area of the drive backplane simultaneously.

According to another aspect of the present disclosure, the laser annealing process performed on the drive backplane further includes arranging a plurality of alignment marks on the drive backplane and aligning the mask by using the plurality of alignment marks.

According to one arrangement of the present disclosure, at least a part of the plurality of alignment marks are used as an electrode pattern.

According to one arrangement of the present disclosure, the laser annealing method performed on the drive backplane further includes etching the poly-silicon layer formed by the poly-silicon patterns, to form a functional pattern.

According to one arrangement of the present disclosure, the mask is a rectangle with an area of a×b, in which a has a value range between 2 cm and 6 cm, and b has a value range between 2 cm and 6 cm.

According to a further aspect of the present disclosure, a mask is provided with a plurality of light transmission areas. The light transmission area is provided with an optical element for adjusting transmitted lights.

According to one arrangement of the present disclosure, the optical element includes a micro-lens or a micro-lens group, configured to focus a laser beam emitted from the laser source.

According to one arrangement of the present disclosure, the size of the micro-lens is presented in a nanometer or in a micrometer.

According to one arrangement of the present disclosure, a plurality of the light transmission areas are arranged on the mask in an array of m×n, in which m≥1 and n≥1.

According to one arrangement of the present disclosure, the plurality of light transmission areas have an identical shape and size.

According to one arrangement of the present disclosure, a of the mask is a rectangle with an area of a×b, in which a has a value ranging between 2 cm and 6 cm, and b has a value ranging between 2 cm and 6 cm.

BRIEF DESCRIPTION OF THE DRAWINGS

The various objects, features and advantages of the present disclosure will be apparent from the following detailed description of the embodiments taken in conjunction with the accompanying drawings. The figures of the present disclosure are only illustrative, but not necessarily to scale. In the drawings, the same reference number will be used throughout the drawings to refer to the same or like parts.

DETAILED DESCRIPTION

Arrangements embodying features and improvements of this disclosure will be set forth below in detail. It should be understood that various modifications may be made in different arrangements without departing from the scope of this disclosure. The specification and drawings in essential are used for description but not limit to this disclosure.

Hereinafter, various example arrangements of the present disclosure will be described with reference to the drawings constituting a part of the present disclosure, in which different example structures, systems and operations of various aspects of the present disclosure can be realized in an example. It should be understood that other specific technical solutions of the components, structures, example devices, systems, and operations may be used and can be structurally and functionally modified without departing from the scope of the present disclosure. Moreover, although the terms "above", "between", "within" etc. may be used in this specification to describe different example features and elements of the present disclosure, these terms are used herein only for convenience, for example, the example direction as described according to the drawings. It should not be understood from any content of the specification that particular three-dimensional direction requiring a structure falls within the scope of the present disclosure.

In some example implementations of the present disclosure, a laser annealing process of a drive backplane applied to a display device is taken as an example to describe the laser annealing process of the drive backplane as proposed in the present disclosure. It would be appreciated for those skilled in the art that various modifications, additions, substitutions, deletions or other variations are made to the following specific implementations in order to apply related designs in the present disclosure to the laser annealing processes of the drive backplane in other types or other types of processes, and these variations are still within the principles of the laser annealing process of the drive backplane proposed in the present disclosure.

Figure 1:
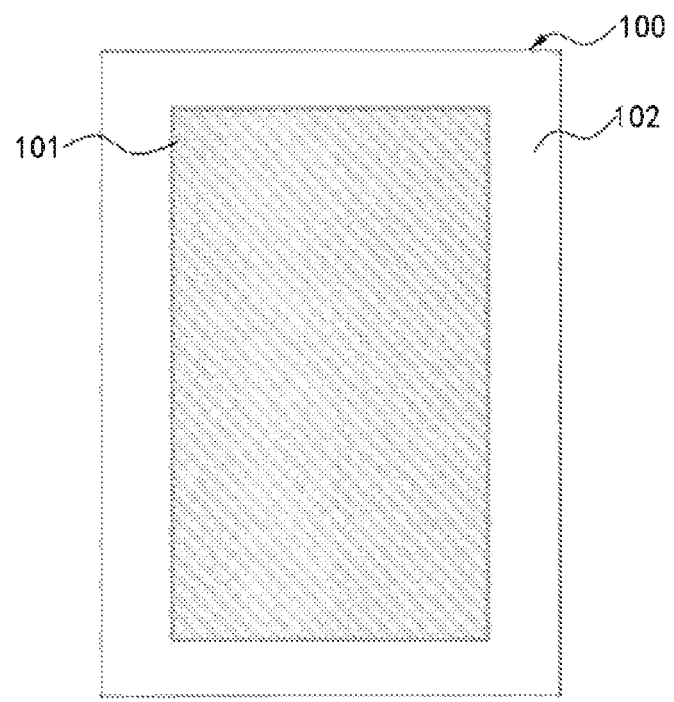
FIG. 1 representatively shows a schematic view of a bottom gate type device.
Figure 6:
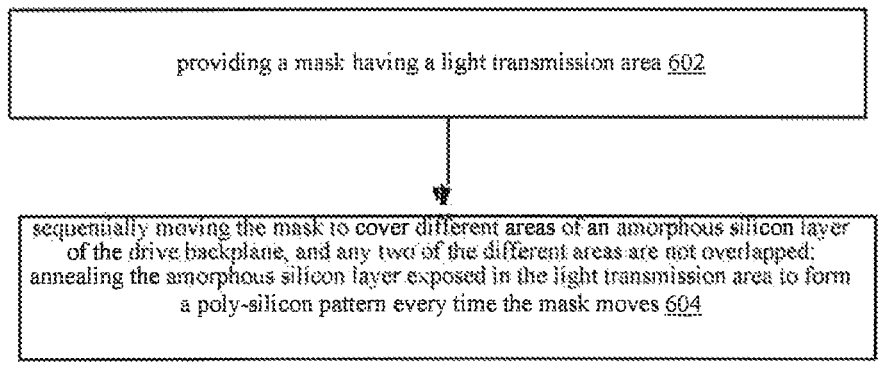
FIG. 6 is a flowchart of a laser annealing process of a drive backplane according to one example implementation.

As shown in FIG. 1, in this arrangement, a drive backplane 100 of a bottom gate type device is particularly taken as an example to describe the laser annealing process of the drive backplane proposed in the present disclosure. FIG. 1 representatively shows a schematic view of the bottom gate type device. Cooperatively referring to FIGS. 2 to 4 and FIG. 6, FIGS. 2 to 4 respectively show schematic views of the drive backplane after the laser annealing process, which can embody principles of the present disclosure. FIG. 6 is a flowchart of a laser annealing process of a drive backplane according to one example implementation. With reference to the above figures, the process of the laser annealing process of the drive backplane proposed in the present disclosure will be described in detail.

In this arrangement, the laser annealing process of the drive backplane proposed in this disclosure mainly includes following blocks:

Block 602: providing a mask, which has a light transmission area; and

Block 604: sequentially moving the mask to cover different areas of an amorphous silicon layer of the drive backplane, and any two of the different areas are not overlapped, and annealing the amorphous silicon layer exposed in the light transmission area to form a poly-silicon pattern every time the mask moves.

As shown in FIG. 1, in this arrangement, an amorphous silicon layer (a-Si) is formed on the drive backplane 100, which can be realized by a process, for example, a vapor deposition. In other arrangements, the amorphous silicon layer is formed on the drive backplane 100 also by using other processes, which are not limited thereto.

Figure 2:
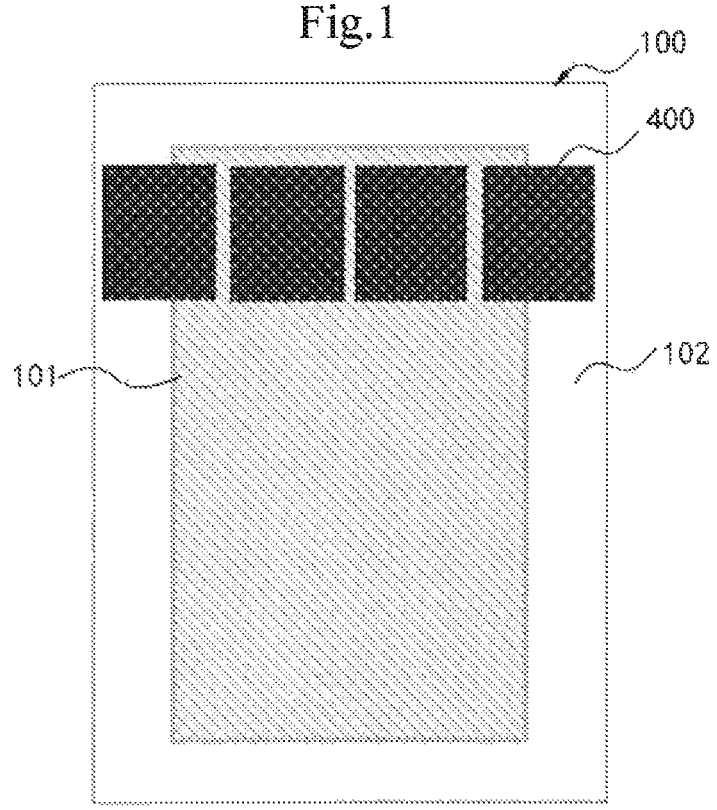
FIG. 2 is a schematic view of a drive backplane after a laser annealing process according to one example implementation.

As shown in FIG. 2, in this arrangement, for forming a poly-silicon (p-Si), an area of the amorphous silicon layer is irradiated by a laser source through a light transmission area of a mask to anneal the area of the amorphous silicon layer exposed in the light transmission area, so that the poly-silicon pattern is formed.

Figure 3:
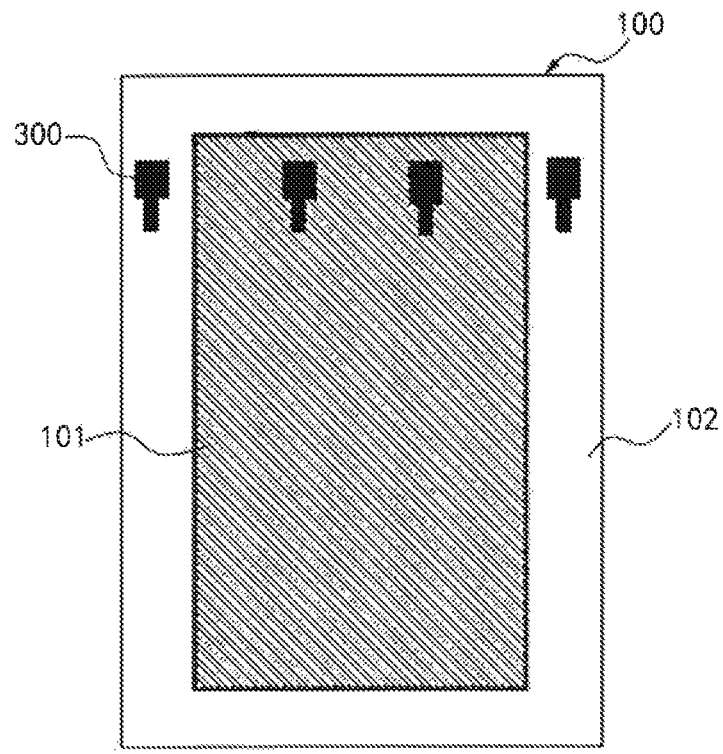
FIG. 3 is a schematic view of a drive backplane after a laser annealing process according to one example implementation.

As shown in FIG. 3, in this arrangement, for forming a poly-silicon by multiple irradiation with the laser source, moving of the mask and the laser source is utilized to anneal other areas of the amorphous silicon layer exposed in the light transmission area so as to form a poly-silicon pattern until a plurality of identical poly-silicon patterns are distributed over all areas of the drive backplane 100 or areas of the drive backplane 100 need to be provided with poly-silicon patterns.

According to the laser annealing process of the drive backplane as provided by the present disclosure, a single mask is utilized to carry out localized laser annealing, and the mask does not need to be replaced during the whole laser annealing process of the drive backplane 100, so that the problem of repeated irradiation can be greatly reduced or eliminated, thus achieving better uniformity on a substrate with a larger area and being suitable for development of the large-area panel process.

As shown in FIGS. 1 to 3, in this arrangement, it is illustrative to take an example that the drive backplane 100 is substantially rectangular. On the basis of this, the mask may be designed, for example, in a substantially rectangular shape. That is, by irradiating the amorphous silicon layer with a laser source through the light transmission area of the rectangular mask, the poly-silicon pattern formed by annealing the area of the amorphous silicon layer exposed in the light transmission area can be substantially rectangular.

Figure 5:
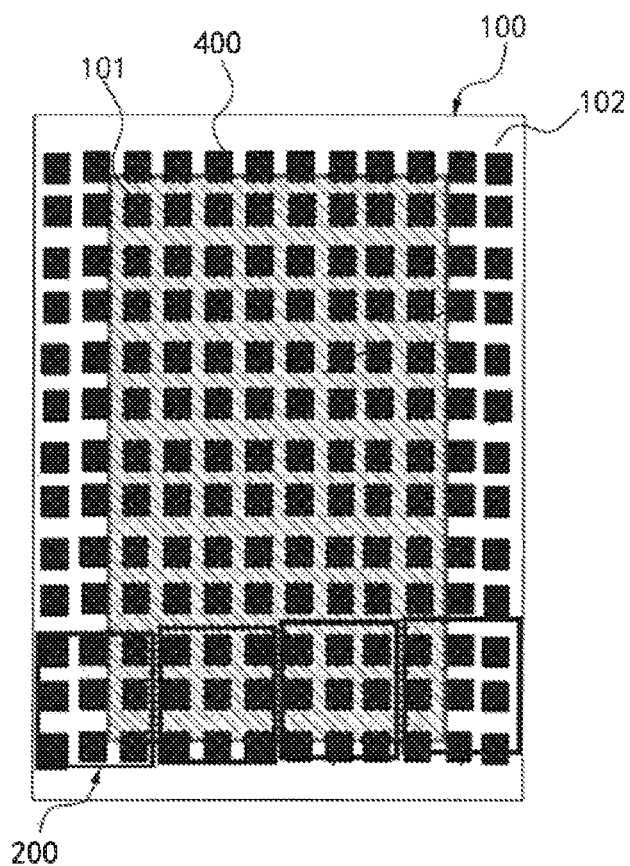
FIG. 5 is a schematic view of a drive backplane after a laser annealing process according to another example implementation.

As shown in FIG. 5, the mask 200 is generally rectangular. In this arrangement, the mask may be a rectangle with an area of a×b, where a has a value ranging, between 2 cm and 6 cm, and b has a value ranging, between 2 cm and 6 cm. For such design, the laser annealing process of the drive backplane provided by the present disclosure can be implemented by using the rectangular mask with the above-mentioned size, so that the structure size of the related drive backplane 100 can be more adapted, and in particular, the structure size of the large-area panel can be more adapted. In some arrangement, the mask 200 covers some of the plurality of areas positioned in a display area 101 of the drive backplane 100 and some of the plurality of areas positioned in a non-display area 102 of the drive backplane 100 simultaneously.

In one arrangement, based on such design that the drive backplane 100 and the mask 200 are substantially rectangular, for moving the mask and the laser source to sequentially irradiate the respective areas, poly-silicon patterns may be arranged in an array mode, for example.

In this arrangement, the light transmission area 210 of the mask 200 may be provided with, for example, optical elements for adjusting transmitted light. For example, in one arrangement, the optical element is a collimator, which can adjust the transmitted light beam into parallel light.

In some other arrangements, the optical element can focus the laser beam emitted by the laser source in the process of irradiating the amorphous silicon layer by using the light source through the light transmission area of the mask, to improve laser irradiation intensity and optimize annealing effect.

Further, on the basis of such design that the light transmission area 210 of the mask 200 is provided with an optical element for adjusting a laser beam, in another arrangement, the optical element may use a micro-lens 220. The micro-lens 220 is a convex lens or a convex lens group to realize an effect of collecting laser energy by using optical characteristics of the convex lens.

Furthermore, on the basis of such design that the optical element adopts a micro-lens, in this arrangement, size of the micro-lens can be presented in nanometers, for example.

In one arrangement, on the basis of such design that the mask is substantially rectangular, for annealing other areas of the amorphous silicon layer to form a poly-silicon pattern, the amorphous silicon layer includes a plurality of areas, each of which is irradiated by the laser once only through the mask. That is, when a plurality of poly-silicon patterns are distributed all over the area of the drive backplane 100 or the area of the drive backplane 100 where the poly-silicon patterns are to be provided, each poly-silicon pattern is formed only by the laser irradiation annealing for one time. That is, for poly-silicon patterns formed by annealing, one-time irradiation but not repeated irradiation is used. Due to the above-mentioned design, the laser annealing process of the drive backplane proposed in the present disclosure is utilized to carry out the laser annealing on the drive backplane 100, which can eliminate the problem of repeated irradiation, thus achieving better uniformity on a substrate with a larger area and being more suitable for the development of the large-area panel process.

In this arrangement, the laser annealing process of the drive backplane proposed in this disclosure further includes arranging a plurality of alignment marks 300 on the drive backplane 100.

As shown in FIG. 3, for arranging a plurality of alignment marks 300 on the drive backplane 100, in this arrangement, a plurality of alignment marks 300 are arranged on the drive backplane 100 before the drive backplane 100 forms an amorphous silicon layer, so that in the respective operations of the laser annealing, the mask can be aligned with the plurality of alignment marks 300, to improve accuracy of each laser annealing, so as to improve a process quality of the laser annealing process and ensure the effect of reducing or eliminating the repeated irradiation.

Further, as shown in FIG. 3, on the basis of such design that the alignment mark 300 is provided on the drive backplane 100, in this arrangement, the alignment mark 300 may be an electrode pattern provided on the drive backplane 100, further may be, for example, a gate pattern or an electrode pattern provided on the same layer with the gate pattern. The drive backplane 100 may be divided into a display area 101 and a non-display area 102 as shown in FIGS. 1 to 3 according to different functions. Based on this, the gate pattern as the alignment mark 300 located in the display area 101 may be used as a gate of the substrate. Furthermore, the gate pattern as the alignment mark 300 located in the non-display area 102 may be correspondingly matched to the gate pattern as subsequently designing the circuit of the non-display area 102. Thus, the problems such as difficult alignment, frequent replacement of the mask, time consumption caused by complex peripheral circuits can be settled.

In this arrangement, the laser annealing process of the drive backplane proposed in this disclosure further includes, after forming a poly-silicon pattern through irradiation by means of a laser source, etching at least part of the poly-silicon layer 400 of the poly-silicon pattern to form a functional pattern.

Figure 4:
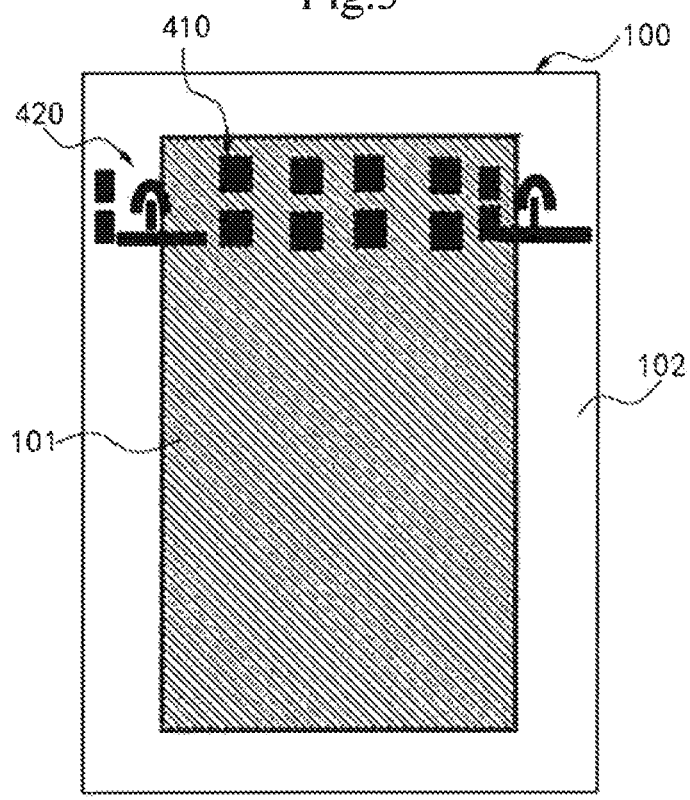
FIG. 4 is a schematic view of a drive backplane after a laser annealing process according to one example implementation.

As shown in FIGS. 2 and 4, for etching the poly-silicon layer 400 to form a functional pattern, in this arrangement, each of the poly-silicon patterns formed in the display area 101 and the non-display area 102 of the drive backplane 100 is etched, and functional patterns in different shapes corresponding to different functional requirements are etched according to different functional requirements of the poly-silicon layer 400 in the display area 101 and the non-display area 102.

Further, as shown in FIG. 4, on the basis of such design that a functional pattern is formed by etching the poly-silicon layer 400, in this arrangement, the functional pattern 410 located in the display area 101 of the drive backplane 100 may be, for example, a plurality of rectangular structures arranged substantially in a array; and the functional pattern located in the non-display area 102 may adopt the corresponding structural design according to the circuit design and other functional requirements of the non-display area 102 of the substrate. In addition, based on the shapes of the drive backplane 100 as well as the display area 101 and the non-display area 102 as shown in FIGS. 1 to 4, the two corresponding functional patterns 420 positioned in the non-display area 102 on the opposite sides of the display area 101 may be the same shape, for example, or may have symmetrical (e.g., axisymmetric or point symmetrical) shape; and the functional pattern located in the non-display area 102 at four corners may also have an irregular shape. In addition, for the functional pattern located in the non-display area 102 at the four corners, since the area is usually provided with a drive circuit or a shift register circuit, the driving capability of the transistors included in the area has higher requirements, so that relevant factors are considered for designing the area of the active layer area.

In some example implementations of the present disclosure, the laser annealing process of the drive backplane proposed in the present disclosure is substantially the same as that of the first arrangement described above. Hereinafter, the processes of this arrangement different from those of the first arrangement will be described in detail.

As shown in FIG. 5, in this arrangement, the mask 200 may include, for example, a plurality of light transmission areas. Due to the above design, for the step of forming the poly-silicon pattern, the area of the amorphous silicon layer is irradiated by using the laser source through the plurality of light transmission areas of the mask 200 to anneal the area of the amorphous silicon layer exposed in the light transmission areas to form the poly-silicon pattern, and the poly-silicon pattern includes a plurality of pattern units respectively corresponding to the plurality of light transmission areas. In view of the above, by designing the number, shape and arrangement of the light transmission areas, the functional pattern as required by the display area 101 may be directly formed by one-time irradiation by means of the above process without etching. It should be noted that after the laser irradiation annealing, the non-crystallized part of the amorphous silicon layer may be etched and removed to avoid affecting the normal display function. In addition, for the non-display area 102, the effect of irregularly directly forming the functional patterns may also include further etching or patterning process in other ways, which will not be repeated here.

Further, on the basis of such design that the mask 200 includes a plurality of light transmission areas, in this arrangement, a plurality of light transmission areas may be arranged substantially in an array on the mask 200, for example. In view of this, for moving the mask 200 and the laser source to sequentially irradiate the respective areas, after laser annealing the respective areas of the drive backplane 100, all pattern units of each of the poly-silicon patterns are arranged substantially in an array on the drive backplane 100.

Further, on the basis of such design that a plurality of light transmission areas of the mask 200 are arranged in an array, in this arrangement, the mask 200 may include, for example, light transmission areas of m×n, in which m≥1, n≥1

Further, on the basis of such design that the mask 200 includes a plurality of light transmission areas, in this arrangement, the shape and size of each light transmission area may be the same.

It should be noted that the laser annealing process of the drive backplane as shown in the drawings and as described in this specification are just several examples of the laser annealing processes that can employ the principle of the present disclosure. It should be clearly understood that the principle of the present disclosure is absolutely not only limited to any detail and any step of the laser annealing process of the drive backplane as shown in the drawings or as described in this specification.

As above described, the laser annealing process of the drive backplane proposed in this disclosure can carry out exclusive annealing of a channel area through a localized laser annealing technology. Since there is no problem of the repeated irradiation, the laser annealing process of the drive backplane can obtain a better uniformity on a large-area substrate, suitable for the development of a large-area panel process, and simultaneously solve the problems, such as difficult alignment, frequent replacement of the mask, time consumption, caused by complex peripheral circuits.

Example arrangements of the laser annealing process of the drive backplane and the mask as proposed by the present disclosure are described and/or illustrated in detail. However, the arrangements of the present disclosure are not limited to the specific arrangements as described herein. Rather, the constituents and/or operations of each arrangement may be used independently and separately from the other constituents and/or operations as described herein. Each constituent and/or operation of one arrangement may also be used in combination with other constituents and/or operations of the other arrangements. As introducing the elements/constituents and the like as described and/or shown in the drawings, the terms "a", "an", "the", "said" and "at least one", when describing element/constituent/or the like as described and/or shown herein, are used to express the presence of one or more the element/constitute/or the like. The terms "include", "comprise" and "have", as used herein, are intended to be inclusive, and mean there may be additional elements/constituents/or the like other than the listed elements/constituents/or the like. In addition, the words "first", "second", or the like, as used in claims, are meant to indication, but not to limit the object to which they modify.

Although the laser annealing process of the drive backplane and the mask as proposed by the present disclosure are disclosed according to different particular arrangements, those skilled in the art would recognize that the implementations of present disclosure can be modified within the spirit and scope of the claims.

What is claimed is:

1. A laser annealing process of a drive backplane, comprising:
    providing a mask having a light transmission area;
    sequentially moving the mask to cover different areas of an amorphous silicon layer of a display area and a non-display area of the drive backplane, wherein any two of the different areas are not overlapped;
    annealing the amorphous silicon layer exposed in the light transmission area to form a poly-silicon pattern every time the mask moves;
    arranging a plurality of alignment marks on the drive backplane; and
    aligning the mask using the plurality of alignment marks, wherein at least a part of the plurality of alignment marks are used as an electrode pattern.

2. The laser annealing process of the drive backplane according to claim 1, wherein the light transmission area of the mask is provided with an optical element for adjusting transmitted lights.

3. The laser annealing process of the drive backplane according to claim 2, wherein the optical element comprises a micro-lens or a micro-lens group, configured to focus a laser beam emitted from a laser source.

4. The laser annealing process of the drive backplane according to claim 3, wherein a size of the micro-lens is presented in a nanometer or in a micrometer.

5. The laser annealing process of the drive backplane according to claim 1, wherein the mask comprises a plurality of light transmission areas.

6. The laser annealing process of the drive backplane according to claim 5, wherein the plurality of the light transmission areas are arranged on the mask in an array of m×n, in which m≥1 and n≥1.

7. The laser annealing process of the drive backplane according to claim 5, wherein the plurality of the light transmission areas have an identical shape and size.

8. The laser annealing process of the drive backplane according to claim 1, wherein the amorphous silicon layer comprises a plurality of areas, and each of the areas is irradiated by a laser for one time.

9. The laser annealing process of the drive backplane according to claim 8, wherein the mask covers some of the plurality of areas positioned in a display area of the drive backplane and some of the plurality of areas positioned in a non-display area of the drive backplane simultaneously.

10. The laser annealing process of the drive backplane according to claim 1, further comprising: etching a poly-silicon layer formed by the poly-silicon pattern, to form a functional pattern.

11. The laser annealing process of the drive backplane according to claim 1, wherein the mask is a rectangle with an area of a×b, in which a has a value ranging between about 2 cm and about 6 cm, and b has a value ranging between about 2 cm and about 6 cm.

* * * * *